United States Patent [19]
Zhang

[11] Patent Number: 6,114,853
[45] Date of Patent: *Sep. 5, 2000

[54] NMR METHODS FOR QUALIFICATION OF SEQUENCE-INDUCED $B_0$ OSCILLATION AND CORRECTION OF THE RESULTANT IMAGE ARTIFACTS IN MRI

[75] Inventor: Weiguo Zhang, Foster City, Calif.

[73] Assignee: Toshiba America MRI, Inc., Tustin, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/882,400
[22] Filed: Jun. 25, 1997
[51] Int. Cl.$^7$ .................................................. G01U 3/00
[52] U.S. Cl. ................................. 324/309; 324/307
[58] Field of Search ..................................... 324/309, 307

[56] References Cited

U.S. PATENT DOCUMENTS

| | | | |
|---|---|---|---|
| 3,753,097 | 8/1973 | Dunand | 324/320 |
| 4,885,542 | 12/1989 | Yao et al. | 324/313 |
| 4,947,120 | 8/1990 | Frank | 324/309 |
| 4,970,457 | 11/1990 | Kaufman et al. | 324/309 |
| 5,010,300 | 4/1991 | Paley et al. | 324/309 |
| 5,122,747 | 6/1992 | Riederer et al. | 324/309 |
| 5,151,656 | 9/1992 | Maier et al. | 324/309 |
| 5,214,383 | 5/1993 | Perlmutter et al. | 324/313 |
| 5,245,286 | 9/1993 | Carlson et al. | 324/319 |
| 5,260,655 | 11/1993 | Cory | 324/309 |
| 5,260,656 | 11/1993 | Cory | 324/309 |
| 5,355,086 | 10/1994 | Ratzel | 324/309 |
| 5,488,950 | 2/1996 | Ehnholm | 600/410 |
| 5,498,963 | 3/1996 | Schneider et al. | 324/309 |
| 5,545,990 | 8/1996 | Keifer et al. | 324/307 |
| 5,560,361 | 10/1996 | Glusick | 600/410 |
| 5,578,923 | 11/1996 | Chen | 324/309 |
| 5,602,476 | 2/1997 | Liu et al. | 324/309 |
| 5,652,514 | 7/1997 | Zhang et al. | 324/307 |
| 5,742,163 | 4/1998 | Liu et al. | 324/309 |

FOREIGN PATENT DOCUMENTS

| | | |
|---|---|---|
| 538 668 A1 | 10/1992 | European Pat. Off. . |
| 2 264 175 | 8/1993 | United Kingdom . |

OTHER PUBLICATIONS

Kumar et al., "NMR Fourier Zeugmatography," *J. Magnetic Resonance*, 18, 69–83 (1975).

Edelstein et al., "Spin Warp NMR Imaging and Applications to Human Whole–body Imaging", *Phys. Med. Biol.*, 25, pp. 751–756 (1980).

Twieg, D.B., "The K–Trajectory Fromulation of the NMR Imaging Process With Applications In Analysis and Synthesis of Imaging Methods," *Med. Phys.* 10, 610–621 (1983).

Sumanaweera, et al., "MR Susceptibility Misregistration Correction," *IEEE Trans. Med. Imag.* 12, 251–259 (1993).

Henkelman et al., "Artifacts In Magnetic Resonance Imaging," *Rev. Magn. Reson. Med.* 2, 1–126 (1987).

*Primary Examiner*—Christine K. Oda
*Assistant Examiner*—Tiffany A. Fetzner
*Attorney, Agent, or Firm*—Nixon & Vanderhye P.C.

[57] ABSTRACT

Nuclear magnetic resonance (NMR) methods are invented which allow for quantification of sequence-induced $B_0$ oscillation in magnetic resonance imaging (MRI). The techniques can be used to study any system malfunction which induces sequence-synchronized phase oscillation of the MR signals. When the oscillation is spatially uniform, methods are also developed to correct the acquired NMR data for minimizing the effects of the oscillation.

13 Claims, 5 Drawing Sheets

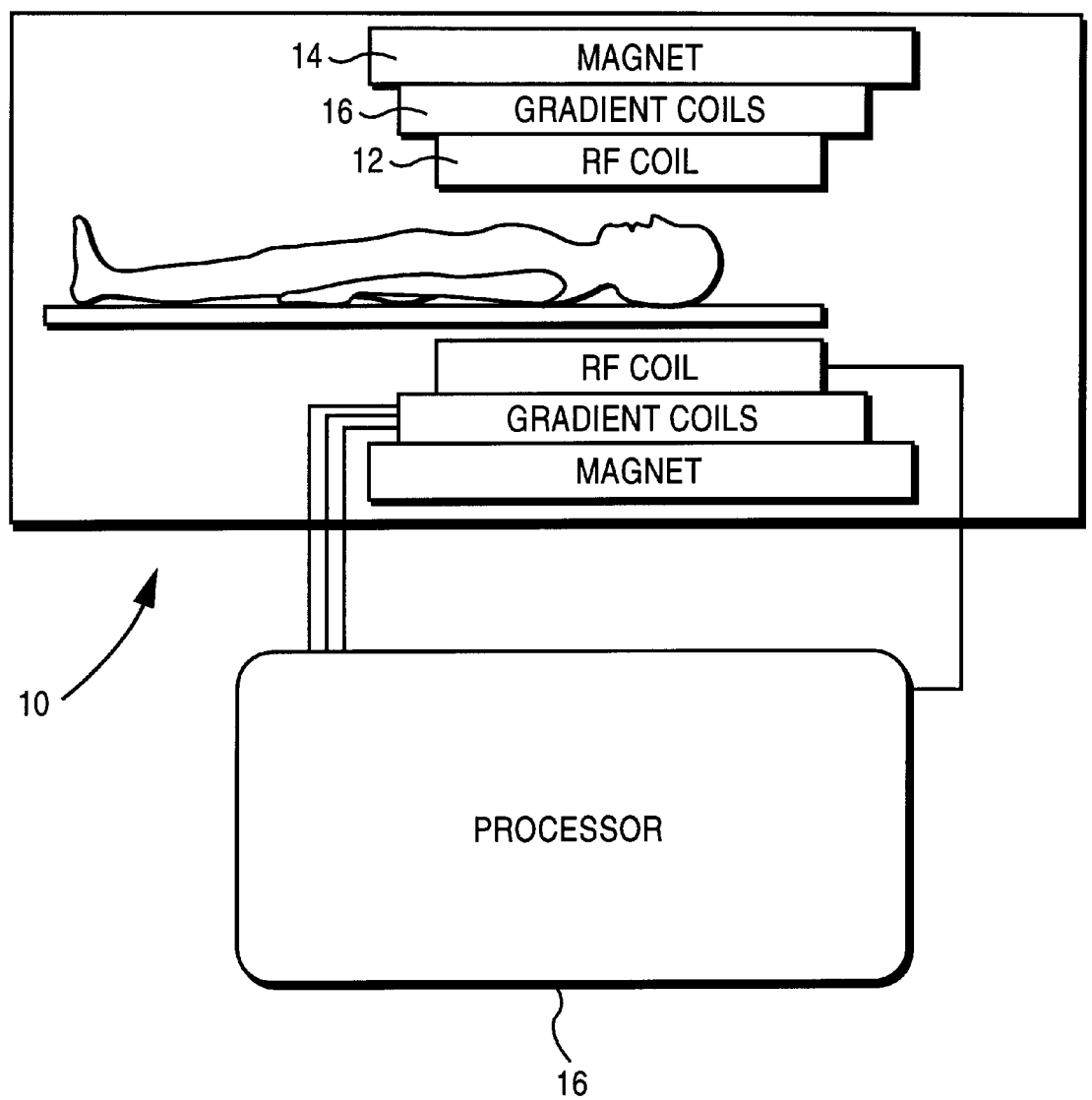

NMR METHODS FOR QUALIFICATION OF SEQUENCE-INDUCED $B_0$ OSCILLATION AND CORRECTION OF THE RESULTANT IMAGE ARTIFACTS IN MRI

BACKGROUND OF THE INVENTION

The present invention relates to magnetic resonance imaging (MRI) and more particularly to apparatus and methods for quantifying sequence-induced $B_0$ oscillation and for correcting associated image artifacts.

MRI relies on a stable main magnetic field ($B_O$) for achieving high spatial resolution and image quality. In a stable field, sequence-controlled field gradients are applied to frequency and/or phase encode the MR signals so that the spatial positions of the signal origins can be determined by analyzing (decoding) the acquired signals. The most commonly used procedures in MRI for signal encoding/decoding are known Fourier methods, such as are described in Kumar, et al., "NMR Fourier Zeugmatography," J. Magn. Reson. 18, 69–83 (1975), and Edelstein, et al., "Spin Warp NMR Imaging and Application to Human Whole-Body Imaging," Phys. Med. Biol. 25, 751–756(1980). In spin-warp imaging techniques, which are the most commonly used Fourier imaging methods in today's practice of MRI, frequency-encoding is achieved by acquiring the signals in the presence of a constant field gradient, and phase-encoding(s) is performed prior to signal acquisition by applying field gradient pulse(s) of fixed duration but with variable strengths.

In practice, however, the $B_0$ field can be time varying and image artifacts are observed as a result. Such artifacts are described in Henkelman, et al., "Artifacts in Magnetic Resonance Imaging, Rev. Magn. Reson. Med. 2, 1–126 (1987), If the $B_0$ fluctuation is relatively slow as compared to the readout time (which is usually in the range of tens of milliseconds), image artifacts are dominantly along the phase-encoding direction(s). On the other hand, artifacts may be limited to the readout direction alone when the $B_0$ fluctuation is sequence-synchronized and the fluctuation is fast relative to the readout time. One example of such sequence-synchronized $B_0$ fluctuation is the fast oscillating $B_0$ shift induced by the sequence-controlled field gradient pulses.

Many techniques have been developed to deal with problems related to $B_0$ instabilities in MRI. Hardware approaches are described in U.S. Pat. Nos. 5,245,286 to Carlson et al., and 5,214,383 to Perlmutter et al. for compensating $B_0$ fluctuation using magnetometer-type sensors and feed-back circuitry. These approaches, however, require the implementation of additional hardware. The quality of field stabilization achieved by these hardware strategies can be hindered by the noise and lag of the circuitry used.

A different kind of approach involves quantifying the $B_0$ fluctuation and then using the information during data processing to minimize the influence of $B_0$ instabilities on the MRI data. Using an electron spin resonator described in U.S. Pat. No. 5,488,950, $B_0$ fluctuation is quantified with high temporal resolution and is then used for correcting the MRI data to minimize the effects of $B_0$ instabilities. However, the electron spin resonator method calls for additional hardware sophistication.

Finally, with NMR methods; (such as are described in Yao, et al., "MRI Compensated for Spurious NMR Frequency/Phase Shifts Caused by Spurious Changes in Magnetic Fields During NMR Data Measurement Process," U.S. Pat. No. 4,885,542 (1989); Kaufman, et al., "MRI Compensated For Spurious Rapid Variations in Static Field During a Single MRI sequence," U.S. Pat. No. 4,970,457 (1990) and Zhang, et al., "Correction for Field Variation in Steady-State MRI by Repeated Acquisition of the Zero k-Space Line," U.S. Pat. No. 5,652,514, signals from the nuclear spins being observed are directly sampled to quantify the $B_0$ time-variation and to guide the data processing for reducing the effects of $B_0$ instabilities. Since the sampling speed of the previous NMR methods are as slow as or even slower than the readout speed of the MRI data, they become ineffective when the $B_0$ fluctuation is relatively fast so that image artifacts exist along the readout direction.

The present invention is not; limited to any particular dimensionality of imaging, but for purposes of illustration only two dimensional (2D) cases are presented herein. X is assumed to be the readout direction and Y is assumed to be the phase-encoding direction. $B_0$ instabilities are assumed to be sequence-synchronized so that the effects are limited to the readout direction only.

FIG. 1 shows a typical spin-warp 2D MRI sequence. A slice of spins are selected by the slice-selective excitation which is achieved by applying a frequency selective radio frequency (RF) pulse in the presence of the slice selection gradient. MR signals are acquired and frequency-encoded during the readout time in the presence of the readout gradient. The phases of the signals are modulated by the application of the phase-encoding gradient which is of fixed duration but with the strength incremented between the projections.

The MRI signal can be described in k-space, according to Twieg, "The k-Trajectory Formulation of the NMR Imaging Process with Applications in Analysis and Synthesis of Imaging Methods," Med. Phys. 10, 610–621(1983), by:

$$S(n_{k_X}, n_{k_Y}) = \int\int M(X, Y) e^{-i2\pi n_{k_X} \Delta k_X X} e^{-i2\pi n_{k_Y} \Delta k_Y Y} dX dY, \quad (1)$$

with $$\Delta k_X = \gamma\left(\frac{\Delta B_0(X, Y, t)}{X} + G_X\right)\Delta t_X, \quad (2)$$

and $$\Delta k_y = \gamma \Delta G_Y \tau_Y \quad (3)$$

where M(X,Y) is the spatial distribution of the magnetization to be observed; $\Delta B_0$ (X,Y,t) is the main magnetic field offset as a function of space and time; $G_X$ is the readout gradient; $\Delta t_X$ is the readout pitch time; $\Delta G_Y$ and $\tau_Y$ are the increment and the duration of the phase-encoding gradient, respectively.

With a stable $B_0$ field, the field offset $\Delta B_0$ varies only in space. Its effects, in such cases, are limited to shifting the readout spatial frequency, $\Delta k_X/\Delta t_X$, by a certain amount which depends on the readout gradient strength and the magnitude of the spatially inhomogeneous $B_0$ offset. However, a time-varying $B_0$ field makes the spatial frequency also time dependent. Such frequency variation behaves in the same way as the frequency modulation (FM) in radio communication, causing side bands of the main signals. In MRI, those side bands correspond to image artifacts. As pointed out previously, sequence-synchronization of the $B_0$ oscillation guarantees that the artifacts exist along only the readout direction.

If the dynamics of the $B_0$ instabilities are spatially uniform, i.e., with the same frequencies/phases/amplitudes for all spatial positions, the effects of the time variations and the spatial inhomogeneities can be disassociated:

$$\Delta B_0(X,Y,t)=\delta B_0(t)+\Delta B_0(X,Y) \quad (4)$$

In such circumstances, quantification of the $B_0$ instabilities, $\delta B_0(t)$, provides sufficient information for correcting the MRI data to reduce the $B_0$ instability effects:

$$S_{Corr}(n_{k_X}, n_{k_Y}) = S_{Acq}(n_{k_X}, n_{k_Y})e^{-i2\pi\gamma\Delta t_x \sum_{j=1}^{n_{k_X}} \delta B_0(j)} \quad (5)$$

where $S_{Acq}$ stands for the acquired MRI data and $S_{Corr}$ for the MRI data after being corrected for the $B_0$ instabilities.

SUMMARY OF THE INVENTION

The present invention provides MRI methods for quantifying sequence-induced $B_0$ instabilities which have relatively high frequencies. The quantification is with spatial resolution, thus providing information about the spatial characteristics of the instabilities. The techniques can be used to study any system malfunction which induces sequence-synchronized phase oscillation of MR signals. When $B_0$ oscillation is spatially uniform, i.e., with the same frequencies, phases, and amplitudes for all spatial positions, methods are also developed to correct the acquired MRI data for reducing the effects of $B_0$ instabilities.

BRIEF DESCRIPTION OF THE DRAWINGS

The purpose and advantages gained by the present invention will be understood by careful study of the following detailed description of the presently preferred embodiment with particular reference to the accompanying drawings.

FIG. 5 is a schematic of a MRI system.

DETAILED DESCRIPTION OF THE PRESENTLY PREFERRED EMBODIMENT

Figure 1:
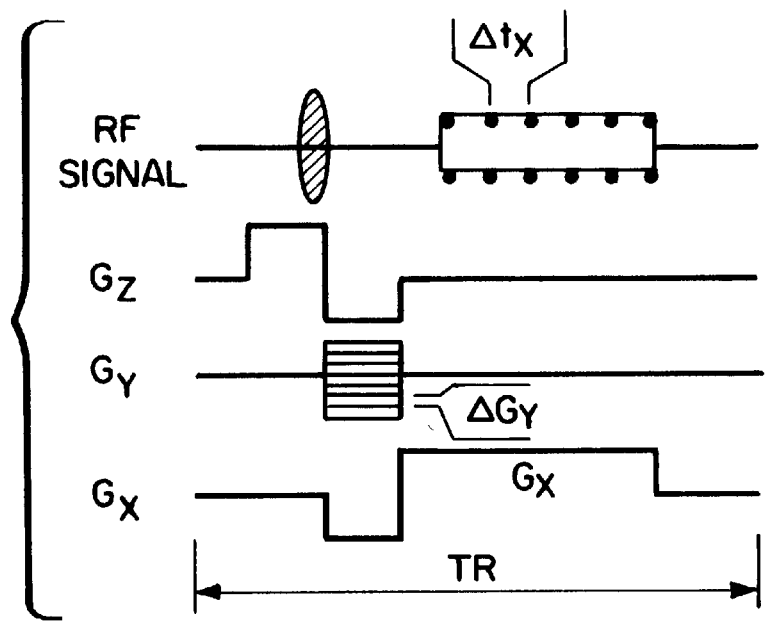
FIG. 1 is a timing diagram of a prior art 2D MRI sequence.
Figure 2:
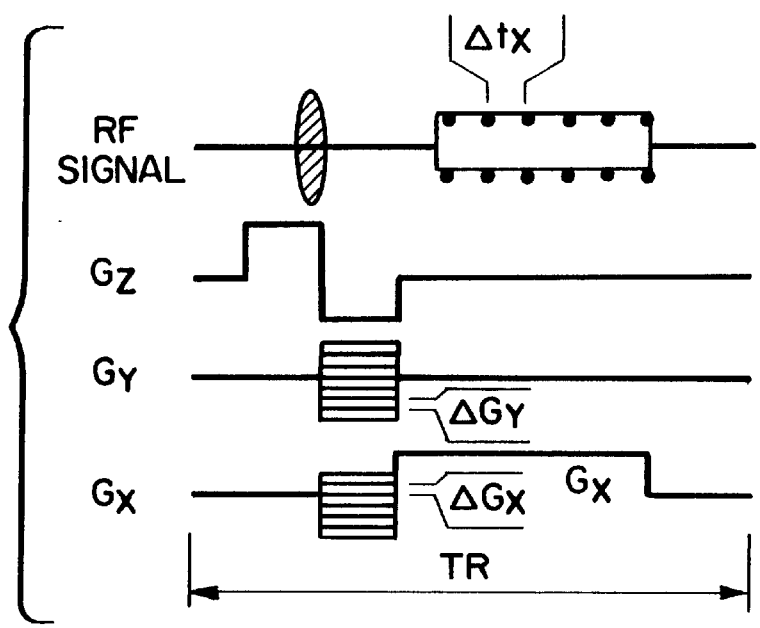
FIG. 2 is a timing diagram of a 2D MRI sequence according to an example embodiment of the present invention.
Figure 3A:
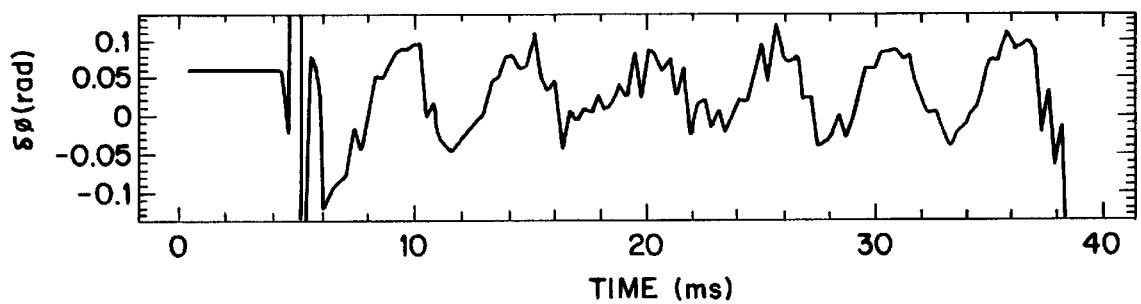
FIGS. 3A to 3F are a set of phase oscillation profiles taken according to an example embodiment of the present invention.
Figure 3B:
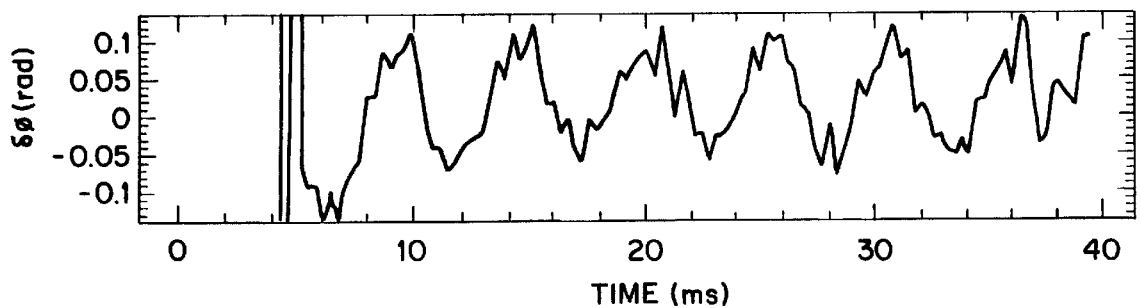
Figure 3C:
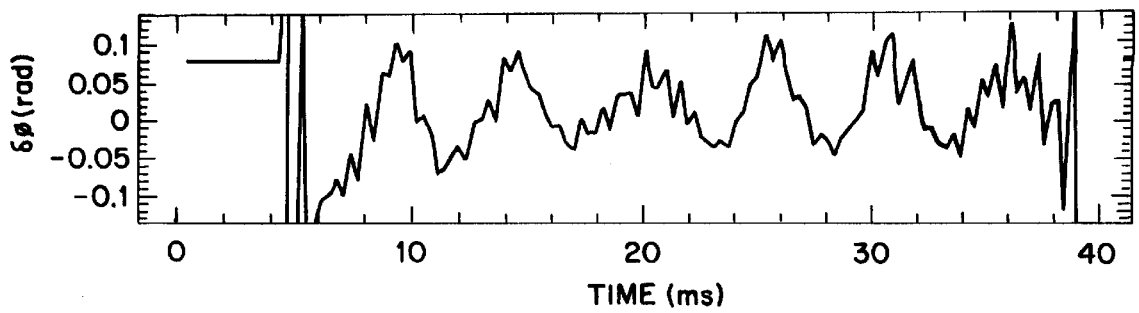
Figure 3D:
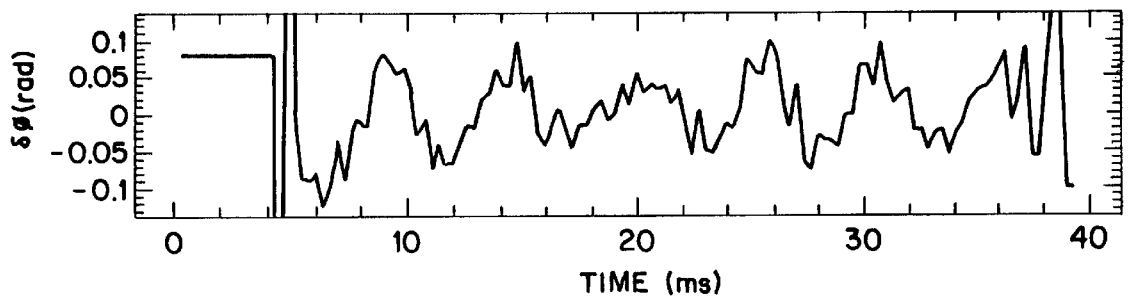
Figure 3E:
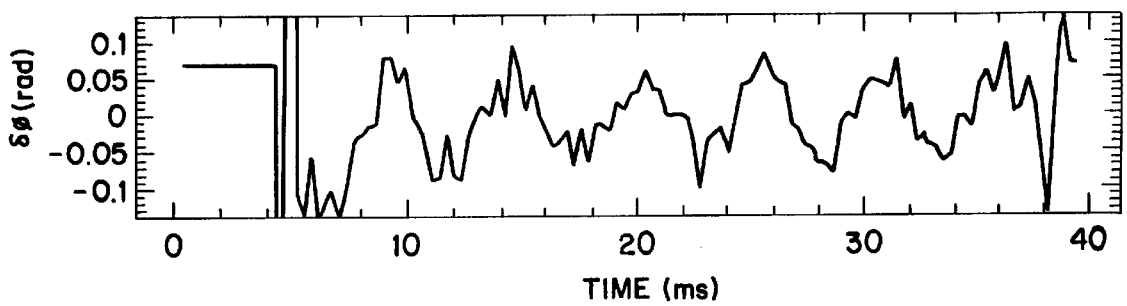
Figure 3F:
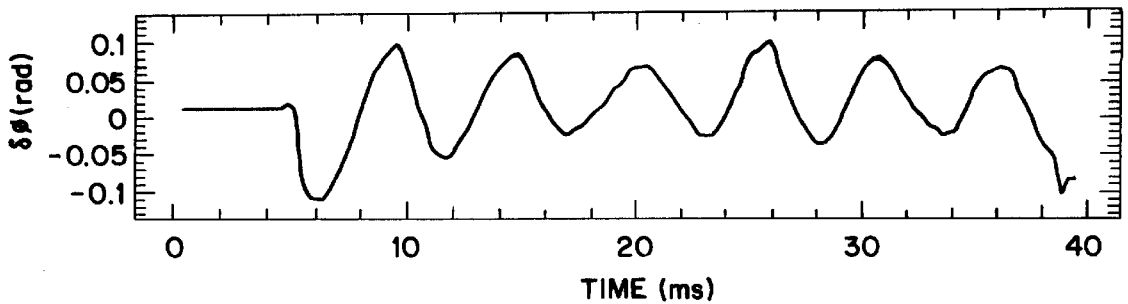

FIG. 2 shows an MRI sequence which was used to quantify sequence-synchronized $B_0$ oscillations according to one example embodiment of the present invention. The sequence is similar to a regular MRI sequence (such as is shown in FIG. 1), except that phase-encoding is performed also along the readout direction in addition to the frequency-encoding of the same direction.

$\Delta G_X$ was set according to the field of view (FOV) in the readout direction, the readout pitch time, and the phase-encoding duration:

$$\Delta G_X = \frac{\Delta t_x}{\tau_Y} G_X \quad (6)$$

The MRI data acquired using a sequence such as is shown in FIG. 2 can be described by $$S(n_{k_x}, n_{k_y}, n_{t_x}) \int\int M(X,Y) e^{-i2\pi n_{k_x} \Delta k_x X} e^{-i2\pi n_{k_y} \Delta k_Y Y} \quad (7)$$
$$e^{-i2\pi\gamma n_{t_x} \Delta t_x \left[G_X X + \sum_{j=1}^{n_{t_x}} \delta B_0(j) + \Delta B_0(X,Y)\right]} dX dY,$$

in the example embodiment, $$\Delta k_x \gamma \Delta G_X \tau_Y \quad (8)$$

After 2D Fourier transformation of the data vs. $\{n_{k_x}, n_{k_y}\}$ the data matrix is translated into a hybrid coordinating system:

$$S(n_x, n_Y, n_{t_x}) M(X,Y) e^{-i2\pi\gamma n_{t_x} \Delta t_x \left[G_X X + \sum_{j=1}^{n_{t_x}} \delta B_0 \phi(j) + \Delta B_0(X,Y)\right]} \quad (9)$$

The signal phase of each pixel $(n_X, n_Y)$ in the hybrid coordinates is given by:

$$\phi(n_x, n_Y, n_{t_x}) = -2\pi\gamma n_{t_x} \Delta t_x \left[G_X X + \sum_{j=1}^{n_{t_x}} \delta B_0(j) + \Delta B_0(X,Y)\right] \quad (10)$$

Since both $G_X$ and $\Delta B_0(X,Y)$ are time invariant within the readout window, their effects can be eliminated by removing the phase ramp.

In order to deal with phase wraparounds, the phase increments within the readout window are calculated for each pixel:

$$\Delta\phi(n_x,n_Y,n_{t_x})=\phi(n_x,n_Y,n_{t_x}+1)-\phi(n_x,n_Y,n_{t_x}) \quad (11)$$

And it is assumed that the phase increments are much smaller than $\pi$ unless there is a phase wraparound. Phase unwrapping is performed if wraparound is detected:

$$\Delta\phi(n_x,n_Y,n_{t_x})-2\pi, \text{ if } \Delta\phi(n_x,n_Y,n_{t_x}) \geq \pi$$
$$\Delta\phi(n_x,n_Y,n_{t_x})=\Delta\phi(n_x,n_Y,n_{t_x}), \text{ if } |\Delta\phi(n_x,n_Y,n_{t_x})|<\pi \quad (12)$$
$$\Delta\phi(n_x,n_Y,n_{t_x})+2\pi, \text{ if } \Delta\phi(n_x,n_Y,n_{t_x}) \leq \pi$$

The phase increments from each pixel are then fit to a constant:

$$C(n_x, n_{Y_t}) = \frac{\sum n_{t_x} \Delta\phi'(n_x, n_Y, n_{t_x})}{N_{t_x}} \quad (13)$$

where $N_{t_x}$ is the number of data points in the readout window.

A phase oscillation profile within the readout window is then constructed by subtracting from $\Delta\phi'(n_X,n_Y,n_{t_x})$ the constant obtained from the data fit:

$$\delta\phi(n_x,n_Y,n_{t_x})=\Delta\phi'(n_x,n_Y,n_{t_x})-C(n_x,n_Y) \quad (14)$$

In case of $B_0$ instabilities, the $B_0$ vibration and the phase oscillation profile are directly related by:

$$\delta\phi(n_X, n_Y, n_{t_x}) = -2\pi\gamma \sum_{j=1}^{n_{t_x}} \delta B_0(j) \qquad (15)$$

$\delta\phi(n_X,n_Y,n_{t_x})$ thus contains information about the system errors within the readout window with temporal as well as spatial resolutions.

When the phase oscillations are spatially uniform, the phase profiles can be used to correct MRI data acquired with the same system specification for eliminating the effects of the said phase oscillations. First, the phase oscillation profiles are spatially averaged over the whole field of view to reduce noise:

$$\delta\phi(n_{t_X}) = \frac{\sum n_X, n_Y \omega(n_X, n_Y) \delta\phi(n_X, n_Y, n_{t_X})}{\sum n_X, n_Y \omega(n_X, n_Y)} \qquad (16)$$

where $\omega(n_X,n_Y)$ is the weighting factor for averaging, which in the preferred embodiment is the signal intensity.

MRI data are then corrected for phase errors according to Eq. 5 using the phase oscillation profile directly:

$$S_{Corr}(n_{k_X}, n_{k_Y}) = S_{Acq}(n_{k_X}, n_{k_Y})e^{-i\sum_{j=1}^{n_{k_X}}\delta\phi(j)} \qquad (17)$$

The phase oscillation profiles, thus quantified using the present invention, can be stored and repeatedly used afterwards for correcting MRI data acquired with the same system specifications.

The present invention was employed in an experimental embodiment on a Toshiba prototype magnet (Toshiba America Inc., South San Francisco), operating at 0.35 Tesla. $B_0$ oscillation was induced in synchronization with the gradient switchings of the sequences. A rectangular phantom filled with baby oil was used for the data presented in this embodiment.

The $B_0$ oscillation data sets were acquired with FOV= $25.6\times25.6$ cm$^2$, slice thickness of 5.0 mm, data matrix of 128 (readout)$\times$32 (phase-encoding)$\times$128 (extra phase-encoding in readout), NA=2, TR=280 ms. The data acquisition time for each data set was about 20 min.

The MRI data were acquired using the same sequence except that the extra phase-encoding in the readout direction was eliminated and the data matrix was 256$\times$256. The acquisition time for each image data set was about 2.5 min.

In both cases, the first 5 ms of the readout window was without data acquisition.

FIGS. 3(A to F) show examples of phase oscillation profiles from one of the $B_0$ oscillation data sets obtained in the experiment. The profiles were selected from five well-separated pixels within the field of view. The profile shown in FIG. 3F is the average of the five phase oscillation profiles, (FIGS. 3A to 3E) indicating that the phase oscillation was spatially uniform.

Figure 4B:
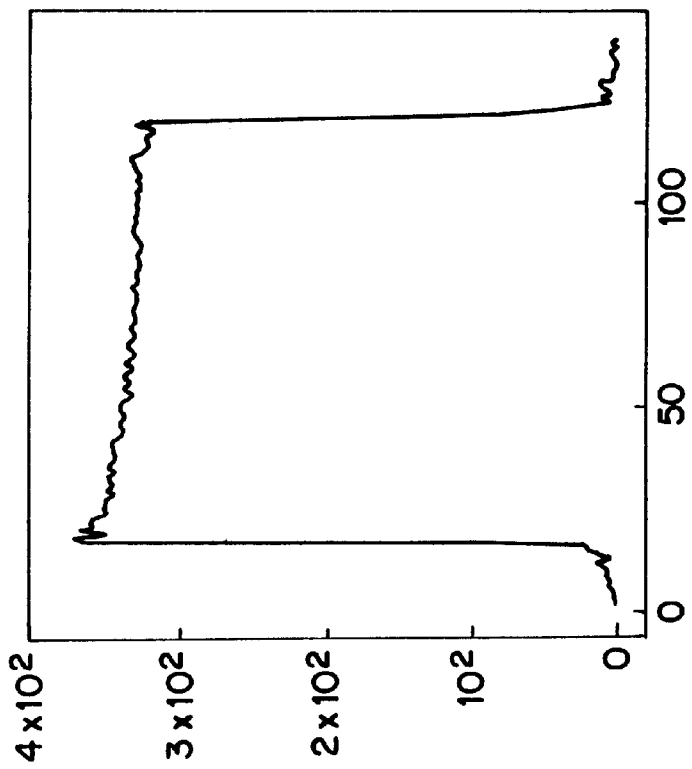
FIGS. 4(A and B) is a set of MRI image profiles without (A) and with (B) correction.
Figure 4A:
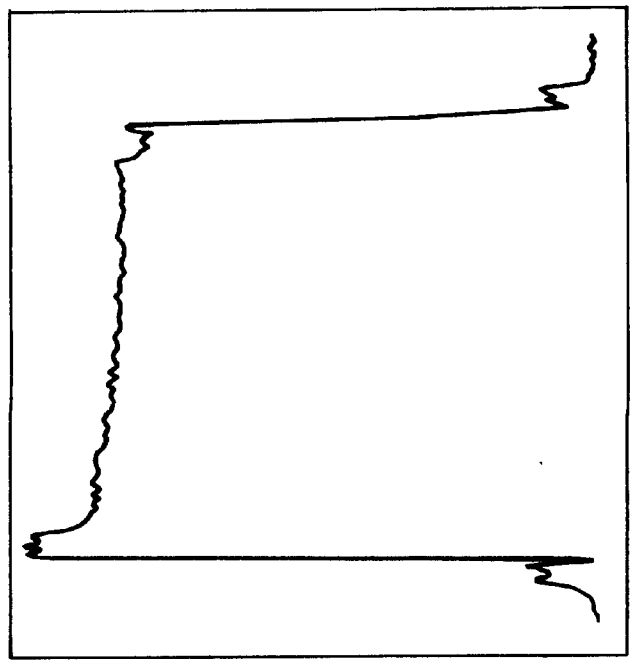

Shown in FIG. 4 are profiles taken from an MR image without (A) and with (B) the phase corrections of the present invention. Note that the edge definition is significantly improved after the corrections.

Although the present invention was demonstrated using the we case where signal errors were caused by the sequence-induced $B_0$ oscillations, it can be applied to any case where signal errors are reproducible and synchronized with the MRI sequence. The causes which cause the signal errors can be any system malfunction.

FIG. 5 shows schematically a MRI system 10 comprising an RF field coil 12; a magnet 14 as a means of producing a static magnetic field; gradient coils 16 for producing gradient magnetic fields in, respectively, slice, phase and readout orthogonal directions of the imaging environment; and a processor 16 for: (1) acquiring NMR data produced in an imaging sequence, (2) performing Fourier transformation along the phase encoding directions for constructing the pixels, (3) producing and storing phase oscillation profiles within the readout window for all said pixels, (4) averaging spatially the said profiles, and (5) correcting MRI data using the said profile for eliminating the phase errors. The gradient coils may produce phase encoding in both the phase and the readout orthogonal directions. The NMR data may be acquired, for example, using a Two Dimensional Fourier Transform imaging sequence or a Three Dimensional Fourier Transform imaging sequence. In addition, the NMR data may be acquired across a field of view composed of a plurality of pixels, wherein the phase oscillation profiles are produced from all of the pixels.

The present invention can be easily extended to three dimensions by selecting a thick slice and performing additional phase encoding along the slice direction.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of acquiring NMR data for quantitating sequence-synchronized field oscillations, comprising the steps of:
   1) acquiring NMR data including information regarding fluctuations in a stable $B_0$ magnetic field;
   2) producing spatially resolved phase oscillation profiles of the $B_0$ magnetic field at a plurality of different spatial positions, during a period in which a readout gradient is being applied to $B_0$ magnetic field; and
   3) correcting the acquired NMR data for the field oscillations using the phase oscillation profiles.
   4) spatially averaging the said phase oscillation profiles produced in step (2); and
   5) in step (3), correcting MRI data according to a spatially averaged phase oscillation profile.

2. A method according to claim 1, wherein the NMR data is obtained in a MRI sequence characterized by the imposition to the magnetic field of magnetic field gradients in, respectively, slice, phase, and readout directions of the imaging environment, and wherein steps 1) and 2) include steps of phase encodings in both the phase and readout directions.

3. A method according to claim 1, wherein the imaging sequence follows a Two Dimensional Fourier Transform sequence.

4. A method according to claim 1, wherein the imaging sequence follows a Three Dimensional Fourier Transform sequence.

5. A method according to claim 1, wherein the NMR data is acquired across a field of view composed of a plurality of pixels, and wherein phase oscillation profiles are produced from all pixels within the said field of view.

6. A method according to claim 1, wherein step 2) further include the steps of:
   a) Fourier transforming the NMR data in all phase encoding directions for constructing the pixels;
   b) calculating the phase increments within the readout window for all said pixels;

c) correcting for phase wraparound in the phase increments obtained in step b);

d) removing phase ramps from the said phase increments.

7. A method of correcting phase errors in MRI data as in claim 1 further comprising the steps:

4) spatially averaging the said phase oscillation profiles produced in step (2); and 5) in step (3), correcting MRI data according to a spatially averaged phase oscillation profile.

8. A method for correcting phase errors in MRI as in claim 7, wherein the phase oscillation profile is stored and repeatedly used for correcting MRI data.

9. A NMR system comprising:

a magnet for producing a static $B_0$ magnetic field;

gradient coils for producing gradient magnetic fields in, respectively, slice, phase and readout orthogonal directions of an imaging environment;

a processor for:

1) acquiring NMR data produced in an imaging secquence during a readout window period, wherein the data includes variations in the static $B_0$ magnetic field occurring during the imaging sequence, 2) performing Fourier transformation along the phase encoding directions of the NMR data for constructing an image representative of the data, 3) producing and storing spatially resolved phase oscillation profiles from the NMR data produced during the readout window period, where the profiles are produced using NMR data acquired while the gradient coils apply a readout gradient, 4) averaging spatially the profiles, and 5) correcting NMR data using the averaged profiles for eliminating the phase errors.

10. A system according to claim 9, wherein the gradient coils produce phase encoding in both the phase and the readout orthogonal directions.

11. A system according to claim 9, wherein the NMR data is acquired using a Two Dimensional Fourier Transform imaging sequence.

12. A system according to claim 9, wherein the NMR data is acquired using a Three Dimensional Fourier Transform imaging sequence.

13. A system according to claim 9, wherein the NMR data is acquired across a field of view composed of a plurality of pixels, and wherein the phase oscillation profiles are produced from all said pixels.

* * * * *

UNITED STATES PATENT AND TRADEMARK OFFICE
CERTIFICATE OF CORRECTION

PATENT NO.  : 6,114,853
DATED       : September 5, 2000
INVENTOR(S) : Zhang

Page 1 of 1

It is certified that error appears in the above-identified patent and that said Letters Patent is hereby corrected as shown below:

Column 1,
Line 62, (application page 3, line 1), after "methods" delete the semicolon.

Column 2,
Line 12, after "not" delete the semicolon (application page 3, line 16).

Column 4,
In equation (8) after $\Delta k_x$ insert an equal sign (=) (application page 7, last line);
In equation (9) after "$S(n_x, n_y, n_{t_x})$" insert an equal sign (=) (application page 8, line 3).
Equation (12) is misaligned. Rewrite as follows:

$$\Delta\phi'(n_x, n_y, n_{t_x}) = \begin{cases} \Delta\phi(n_x, n_y, n_{t_x}) - 2\pi, & \text{if } \Delta\phi(n_x, n_y, n_{t_x}) \geq \pi, \\ \Delta\phi(n_x, n_y, n_{t_x}), & \text{if } |\Delta\phi(n_x, n_y, n_{t_x})| < \pi \\ \Delta\phi(n_x, n_y, n_{t_x}) + 2\pi, & \text{if } \Delta\phi(n_x, n_y, n_{t_x}) \leq \pi \end{cases}$$

Signed and Sealed this

Eighteenth Day of September, 2001

Attest:

NICHOLAS P. GODICI
*Attesting Officer*   *Acting Director of the United States Patent and Trademark Office*